United States Patent [19]

Bower

[11] Patent Number: 4,533,430
[45] Date of Patent: Aug. 6, 1985

[54] PROCESS FOR FORMING SLOTS HAVING NEAR VERTICAL SIDEWALLS AT THEIR UPPER EXTREMITIES

[75] Inventor: Robert W. Bower, Los Gatos, Calif.

[73] Assignee: Advanced Micro Devices, Inc., Sunnyvale, Calif.

[21] Appl. No.: 567,971

[22] Filed: Jan. 4, 1984

[51] Int. Cl.³ .................... H01L 21/306; B44C 1/22; C03C 15/00; C03C 25/06
[52] U.S. Cl. .................... 156/643; 156/646; 156/651; 156/653; 156/657; 156/659.1; 156/662; 204/192 E; 427/88; 427/93
[58] Field of Search ............ 156/643, 644, 646, 648, 156/651, 653, 657, 659.1, 662, 667; 204/164, 192 E; 427/86, 88, 93, 94, 38, 39, 309; 357/47, 49, 55, 65; 148/1.5, 187; 29/576 W, 580

[56] References Cited

U.S. PATENT DOCUMENTS

| | | | |
|---|---|---|---|
| 4,422,897 | 12/1983 | Horwitz | 156/643 |
| 4,432,132 | 2/1984 | Kinsbron et al. | 156/643 X |
| 4,445,967 | 5/1984 | Kameyama | 156/651 X |
| 4,450,042 | 5/1984 | Purdes | 156/643 |

OTHER PUBLICATIONS

Electronics, Nov. 3, 1983, Reactive-ion Etching Eases Restrictions on Materials and Feature Sizes by D. N. K. Wang et al., pp. 157–161.
Annual Review of Material Science, V. 9, 1979, pp. 373–403, Vertial Etching of Silicon at Very High Aspect Ratios by D. L. Kendall.
Proceedings IEDM 83, A Submicron CMOS Megabit Level Dynamic RAM Technology Using Doped Face Trench Capacitor Cell by Kazushige Minegishi et al., pp. 319–322.
J. Vac. Science & Technology, V. 17, No. 5, Sep./Oct. 1980, Dry Etching for Pattern Transfer by H. W. Lehmann et al., pp. 1177–1183.
IEEE Transactions on Electron Devices, V. ED-28, No. 11, Nov. 1981, Reactive Ion Etching for VLSI by L. M. Ephrath, pp. 1315–1319.

Primary Examiner—William A. Powell
Attorney, Agent, or Firm—Patrick T. King; J. Vincent Tortolano

[57] ABSTRACT

A slot formation process is provided in which the regions near the mouth of the slot are coated, while the slot is being formed, with a material which is resistant to the etchant being used to form the slot. The coating may be applied continuously or may be applied at specific points in the slot formation process. During the formation of the middle and bottom regions of the slot the coated upper regions retain a nearly vertical contour shape since they are protected from undesired etching by ions whose trajectories have been impacted by charge accumulations at the mouth of the slot. The coating material may be a thin oxide layer of the semiconductor material or may be a layer of an appropriate etch resistant material.

13 Claims, 22 Drawing Figures

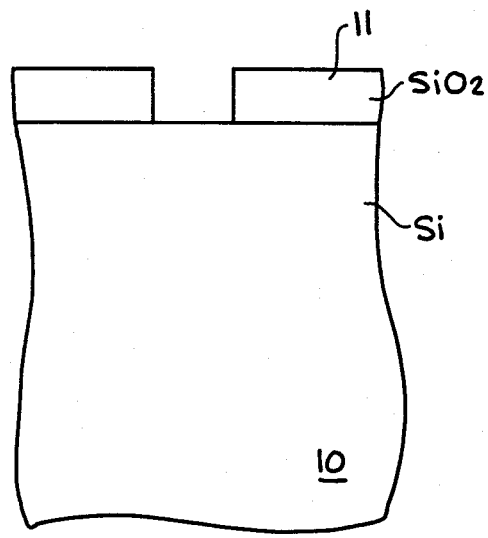
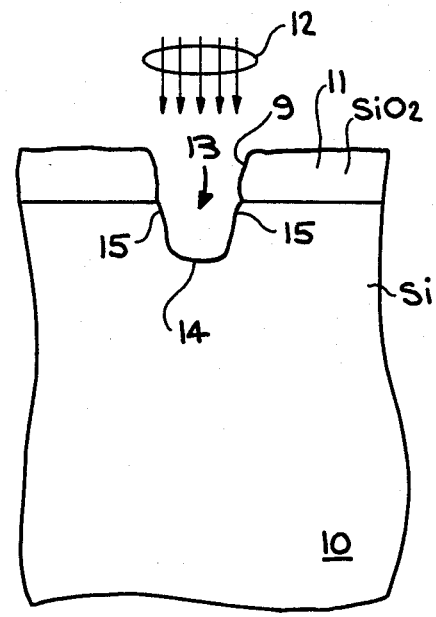
FIG. 1A          FIG. 1B
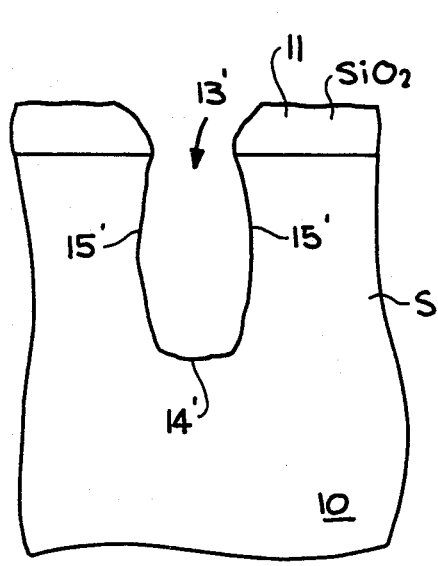
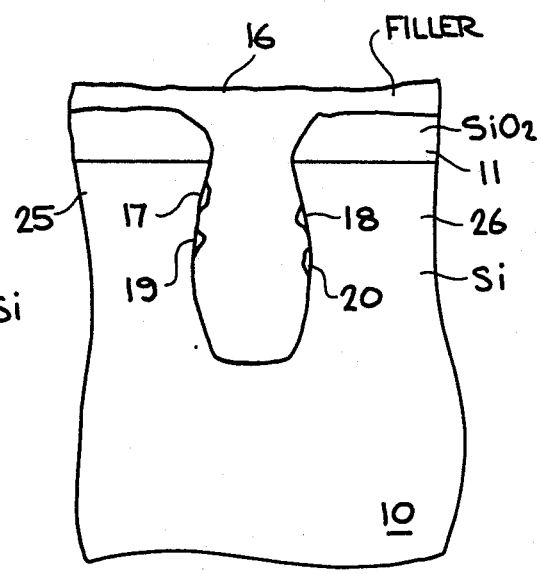
FIG. 1C          FIG. 1D

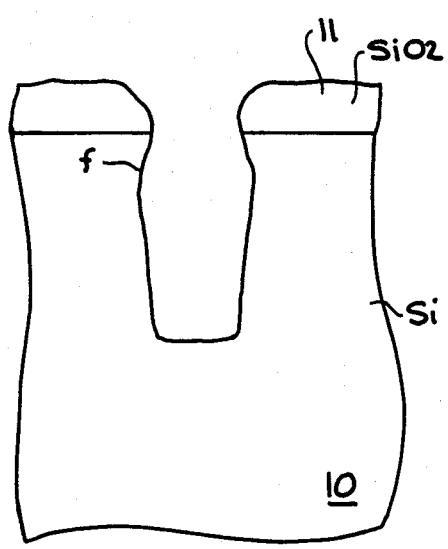
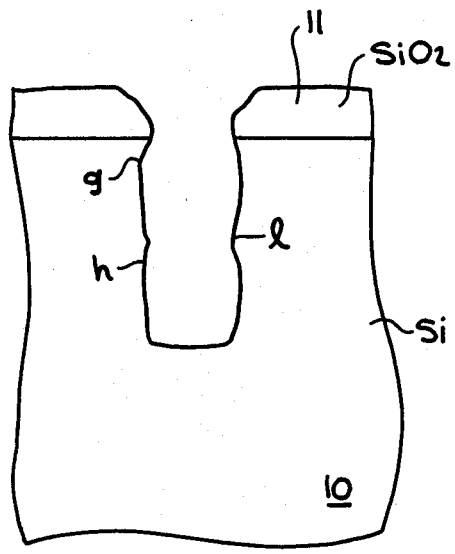
FIG. 7A            FIG. 7B
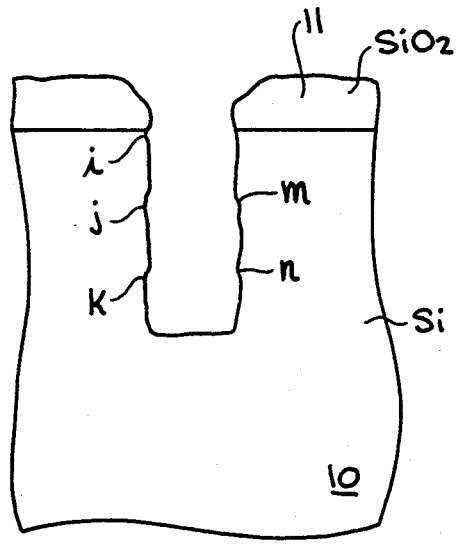
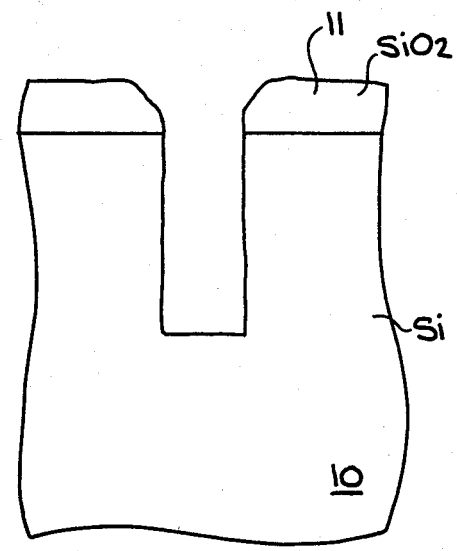
FIG. 7C            FIG. 7D

PROCESS FOR FORMING SLOTS HAVING NEAR VERTICAL SIDEWALLS AT THEIR UPPER EXTREMITIES

BACKGROUND OF THE INVENTION

1. Field of the Invention

This invention relates to a process for forming slots in a semiconductor wafer and, more particulary, relates to a process for forming slots having sidewalls with a desired aspect ratio in regions near the surface.

2. Discussion of Background and Prior Art

The use of slots or trenches is becoming more common in isolating individual devices within an integrated circuit. For certain applications such slots or trenches will be replacing the traditional approaches of pn junction isolation and oxide isolation. See, e.g., D. N. K. Wang et al, "Reactive-Ion Etching Eases Restrictions on Materials and Feature Sizes", *Electronics,* Nov. 3, 1983, pp. 157,159. In addition to the use of slots in silicon wafers for isolating individual devices, such slots may also be used as active elements. For example, a slot may be filled with appropriate materials to serve as a capacitor, see e.g., K. Minegishi et al, "A Submicron CMOS Megabit Level Dynamic RAM Technology Using a Doped Face Trench Capacitor Cell", *Proceedings IEDM* 1983, p. 319. Whether a slot is fabricated for the purpose of isolating devices or for the purpose of being processed to serve as an active element, it is required that the slot formation process not interfere with the formation of other features of the integrated circuit and that the finished slot structure not have a deleterious impact on other structural features or on the electrical operation of the completed integrated circuit.

The traditional technique for fabricating slots, the so-called cut-and-fill technique, has generally not been widely implemented in the semiconductor industry because it has utilized chemical etches which anisotropically etch silicon along specified crystallographic planes. Except for special crystallographic orientations the shape of the etched regions tends to be a V with a high ratio of lateral spacing to depth. Also, while it has been possible to fabricate long narrow grooves in a wafer of precisely specified orientation with careful masking and etching, it has not been possible by chemical means to produce arbitrary shapes or small holes. The direction of etching follows the orientation of the crystal axes so the arbitrary shapes are not possible. See, e.g., D. L. Kendall, "Vertical Etching of Silicon At Very High Aspect Ratios", *Annual Review of Material Science,* 1979, v. 9, pp. 373-403.

The increasing use of slots or trenches as discussed above is due principally to the availability of physical etching equipment such as reactive ion etch equipment. Since the ion beams or plasma action may be directed, etching of arbitrary shapes may be accomplished. Chemically reactive species may also be used in the beams so that the benefits and effects of both physical and chemical etching may be obtained. And, there has been a proliferation of techniques such as selective etching and anisotropic etching using such equipment. See, e.g., H. W. Lehmann et al, "Dry Etching For Pattern Transfer", *J. Vac. Science & Technology,* v.17, No. 5, September October 1980, pp. 1177; L. M. Ephrath, "Reactive Ion Etching for VLSI", *IEEE Transactions on Electron Devices,* V. ED-28, No. 11, Nov. 1981, p. 1315; and D. N. K. Wang et al, "Reactive-ion etching eases restrictions on materials and feature sizes", *Electronics,* Nov. 3, 1983, p. 157. In practice, this equipment may be used to etch slots which are then filled with a suitable filler material, the excess filler material is then removed and the substrate and exposed filler material buried under overlying areas including metallization lines. The slot thus becomes one feature of a layered structure. It is necessary, therefore, that the slots not adversely affect the electrical properties of the surrounding regions or the physical integrity of these regions.

In the formation of slots it is generally desired that the walls have a high aspect ratio or be vertical since high aspect ratios permit deep slots to be formed without unduly great lateral dimensions. This increases the density of integrated circuits. High density integrated circuits would not be possible if lateral dimensions increased proportionally to depth. For example, for bipolar memories a slot may only need to be 5 $\mu$m deep but for linear bipolar devices a slot may need to be as deep as 70 $\mu$m. In the latter case the great depth would not permit high density devices to be fabricated if the lateral spacing was proportional to depth. In practice, after the slots are formed they are filled with material such as polycrystalline silicon, silicon dioxide, polyimide, or like materials. The slots are filled so that after excess filler material is removed the slots present a planar surface on which overlying layers such as conductive metal lines may be applied. If the walls of the slots have severe undulations or overhangs which shadow certain interior regions of the slot, then the slot can be imperfectly filled and voids formed in these shadowed regions. Or if they have bottle shapes there may be centrally disposed voids which are formed as the slots are filled by isotropic growth processes. If voids occur they can become exposed on the surface after removal of excess filler material. If the voids remain exposed during subsequent processing, the irregular topography would be a poor foundation for overlying layers, and particularly for overlying metal layers. The metal layers would be subject to breaking, as shown in the Prior Art of FIG. 1f, thereby lowering yield on a finished wafer. It is therefore highly desirable that slots be formed which do not have concavities, severe undulations or overhangs near the surface that would shadow the source of filling material or otherwise produce incomplete filling and allow voids to be generated which may subsequently be exposed on the surface.

Throughout the remainder of this specification the slot formation process of the present invention will be described in the context of silicon processing, the prevalent type of semiconductor material processing. The process applies as well, however, to other semiconductor materials such as germanium or III-V compounds such as gallium arsenide, indium phosphide, and like materials. The problem of irregular topography due to voids in the upper regions would need a solution in each of these processing regimes.

It is therefore an object of the present invention to provide a process for producing slots having a desired aspect ratio and near vertical orientation and without concavities or overhangs near the surface of the slot.

It is another object of the present invention to provide a process for producing slots which do not have a bottle shape, at least adjacent critical upper regions of the slot.

It is another object of the present invention to provide a process which coats the upper regions of a slot being formed to prevent those regions from experiencing unwanted etching as the etching process is continued to form the bottom regions of the slot.

BRIEF DESCRIPTION OF THE DRAWINGS

For a more complete understanding of the slot formation process of the present invention, reference may be had to the accompanying drawings which are incorporated herein by reference and in which:

FIG. 1a is a cross-sectional view of a silicon wafer overlaid by a silicon dioxide mask defining a slot region to be formed;

FIG. 1b shows the region of FIG. 1a after a short bombardment by a stream of directed ions 12;

FIG. 1c is a cross-sectional view of the region shown in FIGS. 1a and 1b after a slot 13' has been fully formed;

FIG. 1d is a cross-sectional view of the region shown in FIG. 1a after slot 13' has been filled;

FIGS. 5 and 6 are cross-sectional views of partially formed grooves which illustrate the impact of charging upon the ion trajectories, wherein FIG. 5 shows the condition of positive charging and FIG. 6 shows the condition of negative charging;

FIG. 7a is a cross-sectional view of a fully formed slot having a realistic bottle shape with the greatest girth being found in the upper regions;

FIG. 7b is a cross-sectional view of a fully formed slot to which an etch resistant coating has been applied once during the slot formation process;

FIG. 7c is a cross-sectional view of a fully formed slot to which an etch resistant coating has been applied twice during the slot formation process; and FIG. 7d is a cross-sectional view of a fully formed slot to which an etch resistant coating has been applied continuously during the slot formation process.

SUMMARY OF THE INVENTION

In an ideal case of anisotropic etching a beam of ions produces a perfectly vertically walled slot in a substrate. In practice some degree of horizontal etching also occurs which causes a bottled shape in the slot. A slot formation process is provided in which the upper regions of a partially formed slot are coated, while the slot is being formed, with a material which is resistant to the etchant being used to form the slot. The coating material may be applied continuously or at several distinct points in the process. During the formation of the lower regions of the slot the critical upper regions retain a nearly vertical contour since they are protected from undesired etching to the extent of the etch resistance of the coating material as compared with the substrate. The effect of the process described is to reduce bottling. The coating may be a grown, deposited or chemically formed layer of silicon dioxide having a thickness on the order of tens or hundreds of Angstroms or may be a deposited layer of a suitable etch resistant material such as silicon nitride.

DESCRIPTION OF THE PREFERRED EMBODIMENTS

Figure 6:
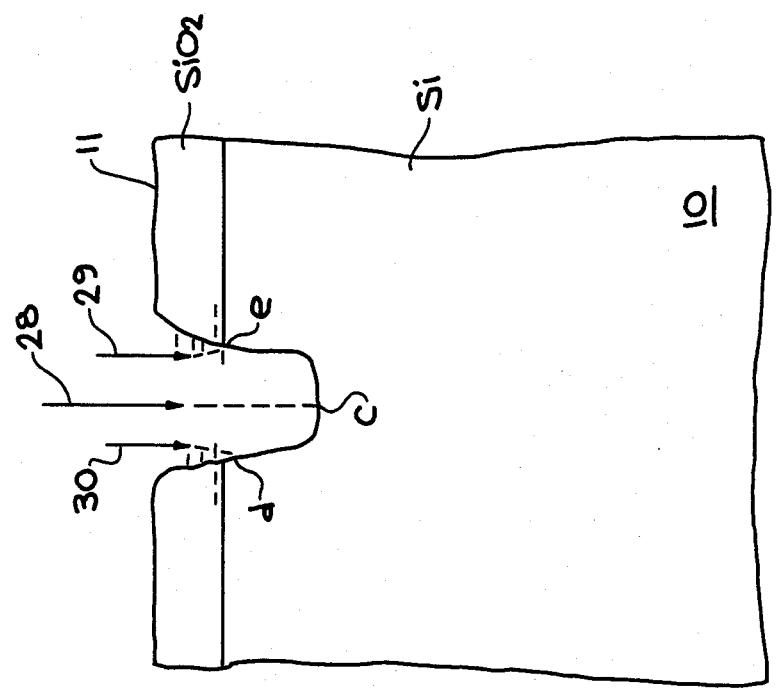
Figure 5:
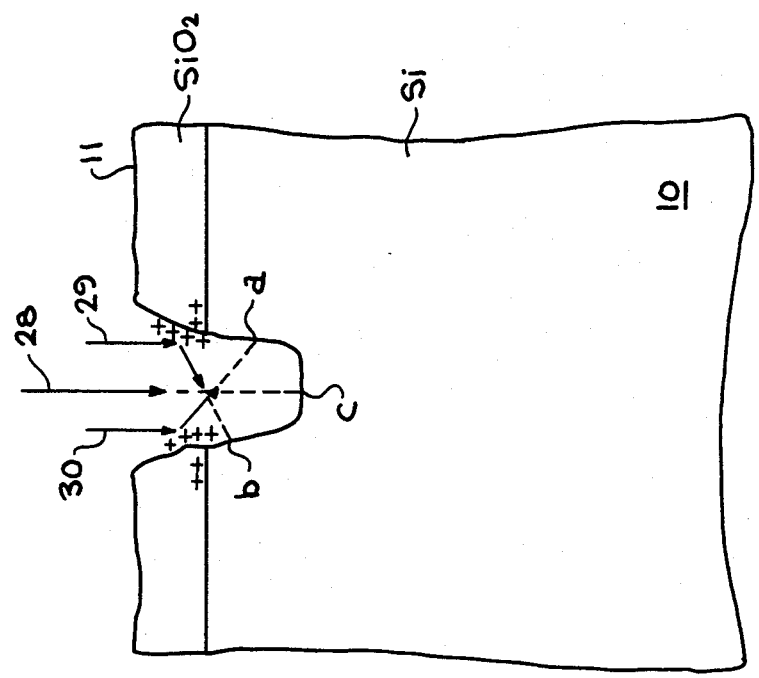

In selecting anisotropic chemical etches to produce slots of high aspect ratio in silicon, the theoretical etch characteristics would seem to permit aspect ratios of 100:1 or greater. However, this is only for silicon wafers of known orientation and only for slots along specific crystallographic planes. Physical dry etch processes should permit the fabrication of structures of arbitrary shape in silicon. The directionality of charged particle beam etchants would seem to permit holes, ledges or slots of high aspect ratio to be formed. However, practical problems arise which do not allow extremely high aspect ratios or near vertical walls to be achieved in practice. For example, with reactive ion etch equipment, the portion of the beam of directed ions which forms the slot must pass through the open mouth of the slot before the ions in the beam can strike the bottom of the forming slot to etch silicon from the substrate. If charging occurs then the trajectories are affected. Whatever the mechanism of charging, as discussed subsequently, charging can have a deleterious impact on subsequent processing. While the mechanism of charging is not fully understood, it could occur, as shown in FIGS. 5 and 6 in the overlying layer and at the silicon interface due to potentials produced in an RF generated plasma. The effects of the resulting changes in the trajectories of the directed beam are most severe if the overlying layer is a dielectric. It is less severe if the overlying layer is conductive, e.g., is a metal. It is not necessary to be quantitative in describing the spurious electric fields that are formed but the charges producing the fields are shown pictorially in FIGS. 5 and 6. It is a reasonable assumption that otherwise linear trajectories of the directed beam are affected, particularly near the edges of the mouth of the forming slot. Thus, when positive charging occurs, an ion having a trajectory 28 straight down the center of the slot being formed is not likely to be significantly affected since it will have compensating influences from charges all around the opening of the slot. It is most likely to travel downwardly to an impact point c on the bottom of the forming slot where it will etch away some number of silicon atoms. However, an ion having a trajectory 29 or 30 adjacent an edge of the mouth or the overlying mask layer will tend to be deflected away from that edge and towards an opposing wall (virtually all ions used in reactive ion processes are positive ions). As is well known, the closer the ion is to the edge without physically hitting it, the stronger will be the forces that affect the trajectory. Thus, for an ion with a trajectory 30 the impact on the opposing wall could be at point a, and for an ion with a trajectory 29 an impact on the opposing wall at point b could be seen. The impact points a and b will tend to produce a bottle shape as shown by concavity 15' in FIG. 1c. If the stream of ions had a negative potential they would have been attracted to the adjacent wall and produced a concavity at a higher point in the slot akin to the impact points d and e shown in FIG. 6. If, on the other hand, negative charging occurs, an ion having a trajectory 28 will still not be significantly affected since it also will have compensating influences from charges around the mouth. Of course, if the mouth has a shape other than a circular shape, then there might be a net impact on the trajectory of a centrally disposed ion 28. However, it is still more likely that ions having a trajectory 29 or 30 adjacent an edge of the opening of the slot or the overlying mask 11 will more likely be attracted to the slot since the positive ion will be attracted toward the negatively charged wall. Thus, an ion with the trajectory 30 is likely to be drawn into the negatively charged wall to have an impact point d. An ion with a trajectory 29 is likely to be drawn into the wall to have an impact point e on the adjacent wall. The net result will be that the critical upper regions of the slot are more likely to have less than a desired vertical shape. While the charging mechanism described may have a major effect on the contour of the walls, other physical mechanisms such as effective gas temperature, plasma bias, deflection of ions from the slot walls, and/or chemical exchange mechanisms all could also contribute to a non-ideal or bottled slot.

The process of the present invention does not eliminate these effects but coats the wall with a thin film which is resistant to etching by the ions which cause non-vertical etching. While the charging mechanism could theoretically be eliminated by the appropriate application of a dielectric to form a charge barrier, this is a complex and less desirable solution than coating to prevent unwanted etching as is done with the present invention. The film may be very thin, on the order of tens to hundreds of Angstroms, and need not be absolutely resistant to etching since in practice, it is believed that only a small fraction, e.g., 1% or less, of the ions will have a trajectory that is significantly deflected. Most of the ions will continue on a trajectory in the original direction of the beam and reach the bottom surface 14 of the slot 13 being formed, as shown in FIG. 1b.

Figures 1E, 1F:
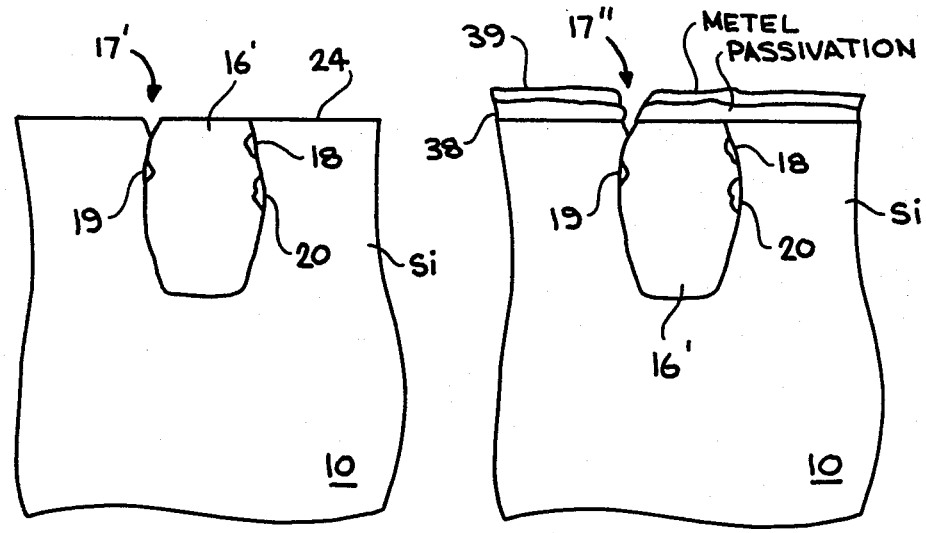
FIG. 1e is a cross-sectional view of the region shown in FIG. 1d after excess filler material has been removed from the upper region.
FIG. 1f is a cross-sectional view of the region of FIG. 1e after overlying layers of a passivation material and metal have been applied.

The problem addressed by the process of the present invention may be seen by reference to FIGS. 1a-1f. In FIG. 1a a semiconductor wafer 10, shown to be silicon, in partial cross-section, has an overlying mask layer of silicon dioxide 11. The mask layer has been opened up to define a region of silicon in which a slot 13 is to be formed. A directed ion beam 12, shown in FIG. 1b, such as that produced by a reactive ion etch machine, is directed towards slot region 13 in a direction which is generally orthogonal to the surface of silicon substrate 10. As a result, a slot 13 begins to form. During formation the slot has a bottom portion 14 and sidewalls 15. Since the beam is larger than the slot, there is also some etching of the silicon dioxide mask at edges 9. However, reactive ion etches which are preferential for silicon over silicon dioxide, such as those disclosed in D. N. K. Wang et al, "Reactive-ion Etching Eases Restrictions on Materials and Feature Sizes", *Electronics,* Nov. 3, 1983, p. 157 and L. M. Ephrath, "Reactive Ion Etching for VLSI", *IEEE Transactions on Electron Devices,* v. ED-28, No. 11, Nov. 1981, p. 1315, are likely to be used so that the effect on the edges 9 of silicon dioxide layer 11 is likely to be minimal. As a result of the charging, whatever its origin, described above with reference to FIGS. 5 and 6, as slot 13 is formed concavities 15' are introduced in the walls of the slot. These concavities are troublesome in critical upper regions down to which the surface is etched back since they can produce voids by various mechanisms and adversely affect overlying layers. A near vertical sidewall or high aspect ratio for the walls is acceptable; overhangs or concavities are undesirable in these critical upper regions.

When the slot is fully formed as shown in FIG. 1c, the fully formed slot 13' has a bottle shape with a bottom 14' and concave sides 15'. In order to produce device isolation and yet not present an open pit to overlying layers, a filler material 16 is introduced to slot 13'. Typical materials are silicon nitride, silicon dioxide, organic materials, metals, polycrystalline silicon and various metal oxides. The choice of filler material will be based on desired function (isolation versus active device), the size and shape of the slot and on the prospect of avoiding the use of an additional mask. As a result of the concavities 15', voids may form along the walls. These voids cause no problem unless they are formed in the critical upper regions, i.e., the region down to which etchback occurs. For slots of total depths of 5-70 μm this critical region is of the order of a micron. As shown in FIG. 1d, voids 17, 18, 19 and 20 are formed along the bottle shaped wall at decreasing depths. The voids are not a problem per se since they do not affect the isolation between device regions 25 and 26. However, in normal semiconductor device fabrication the mask layer of silicon dioxide 11 and the excess filler material 16 is etched off to expose the surface 24 of silicon substrate 10, as shown in FIG. 1e. Voids 18, 19 and 20 are beneath surface 24 and pose no structural problem. However, surface 24, which is composed of portions of the surface of silicon substrate 10 and of the surface of residual filler region 16', is interrupted by a pit 17' formed as a result of the void 17. When an overlying layer 38 of passivation material such as silicon nitride is applied and thereafter a metal layer 39 is applied, the metal layer is severed into two electrically separated regions 21a and 21b the break region 17'' formed where pit 17' was exposed in surface 24. Such a break is highly undesirable since it renders an integrated circuit dysfunctional and lowers wafer yield.

Figures 2A, 2B:
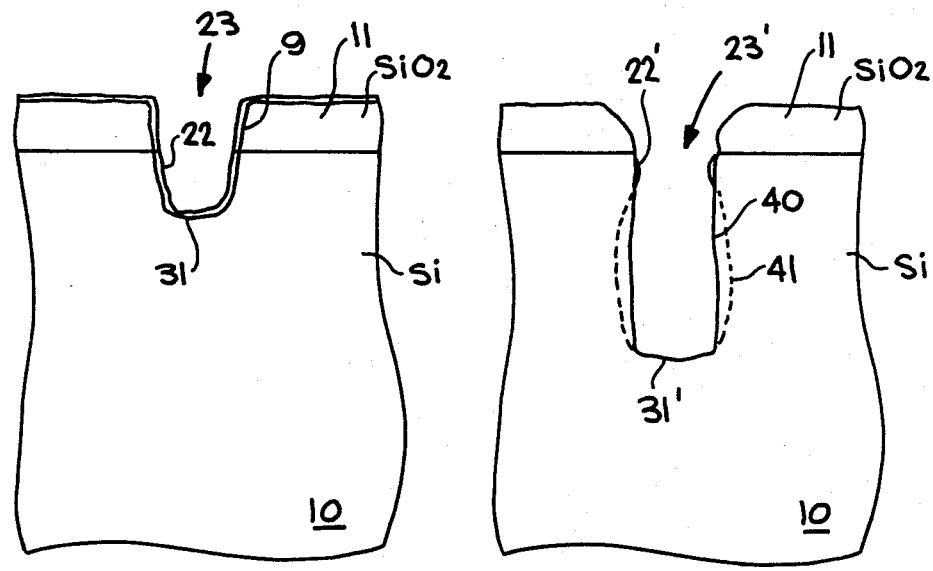
FIG. 2a is a cross-sectional view of the region of FIG. 1b after a coating 22 has been applied to the exposed, partially formed groove and to the upper surface of the silicon dioxide mask.
FIG. 2b is a cross-sectional view of the region of FIG. 2a after the slot has been fully formed.
Figure 2C:
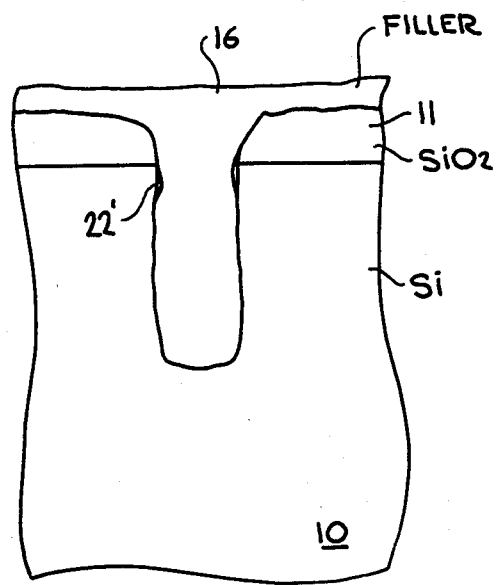
FIG. 2c is a cross-sectional view of the region of FIG. 2b after the fully formed slot has been filled.
Figure 2D:
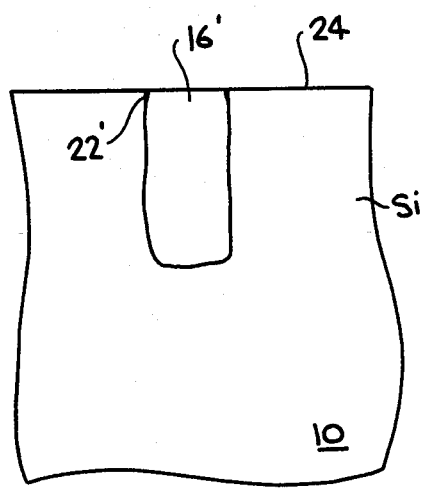
FIG. 2d is a cross-sectional view of the region of FIG. 2c after the filled slot has had excess filler material removed.
Figure 2E:
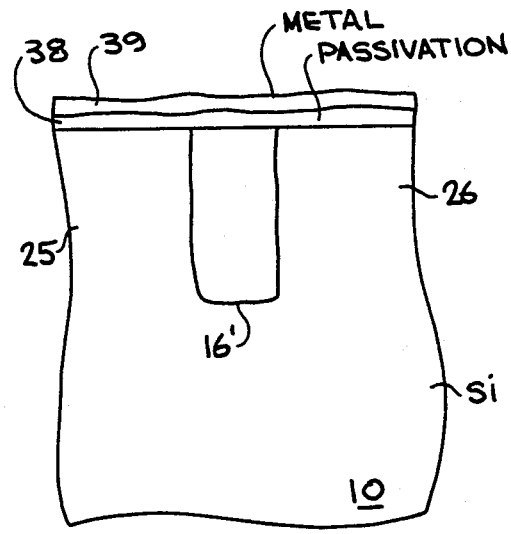
FIG. 2e is a cross-sectional view of the region of FIG. 2d after layers of passivation and metal have been applied.
Figure 3:
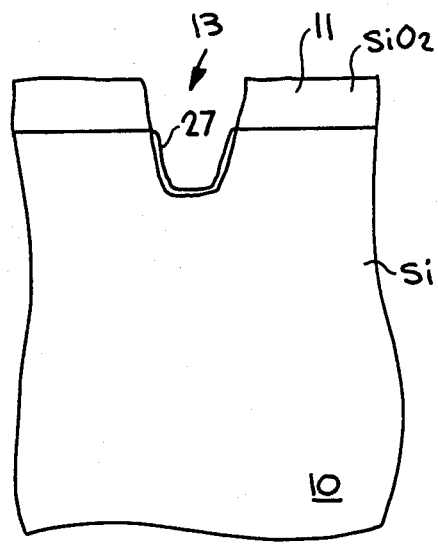
FIG. 3 is a cross-sectional view of FIG. 1b after a layer of silicon dioxide has been grown on the exposed silicon surface of the partially formed slot.

In accordance with the process of the present invention shown in the process sequence of FIGS. 2a-2e, the slot 23, while it is being formed, is coated by coating material 22 early in the slot etching process. FIG. 2a is derived from the prior art process step of FIG. 1b where the slot is partially formed. In FIG. 2a the coating 22 is shown to be applied at an early stage of the process, by means such as chemical vapor deposition or molecular beam epitaxy. Thus, the coating 22 covers not only the interior walls of the slot 23 but also the edges 9 of the silicon dioxide mask layer 11. Alternately, as shown in FIG. 3 the coating may be produced by thermally oxidizing the exposed silicon surface in the slot while it is being formed. This can be accomplished, for example, by immersing in 30% hydrogen peroxide for ten minutes, or by conventional thermal oxidation techniques.

The coating applied in the process of the present invention may be applied at a particular point in the process, at successive points in the process, or continuously. It is preferred that the coating be formed continuously as etching progresses since the greatest reduction in bottling will be experienced. Continuous formation is possible by using a partial pressure of oxygen during the etching process. Thus, the sidewalls will be slowly oxidizing as the bottom of the slot is being ground away. The thin oxide layer of tens or hundreds of Angstroms in thickness is sufficient to protect against bottle shapes in the upper regions. The benefits of continuous formation may be seen by reference to FIGS. 7a–7d. In FIG. 7a fully formed slot of the prior art is depicted. The greatest girth to the bottle occurs around diameter f in the upper regions since the lateral etching mechanisms have had the longest time to operate. In FIG. 7b a fully formed slot is depicted in which a coating was applied once the slot was formed to the level 1. There are now two bottle shapes having maximum girth, at diameters g and h. And in FIG. 7c a fully formed slot is depicted in which coatings were applied twice—when the slot was partially formed to level m and then when the slot was partially formed to level n. There are three bottle shapes with maximum girths at diameters i, j and k. As the number of coating steps increases, the maximum girths decrease and approach the diameter of the slot at its mouth. Thus diameter f is greater than diameters g and h, which in turn are greater than diameters i, j and k. Consequently, as the number of coating steps increases, e.g. as n=1,2,3 . . . , a nearly vertical sidewall is produced. A high value for n is, of course, synonomous with continuous coating.

As the etching process continues, as shown in FIG. 2b, e.g., as a directed ion beam is aimed into the slot 23 being formed, the coating 22 protects the sidewalls in the critical upper regions. The coating which is at the bottom 31 is soon etched by the impingement of the majority of the ions. The portion of coating 22 on the upper regions of the slot 23 being formed serves to protect those regions from being etched by ions having their trajectories deflected by the charging effects, as shown and discussed with respect to FIGS. 5 and 6. By the time the slot is fully formed, shown in FIG. 2b, only a small portion 22' of the upper portion of the coating remains. Whether the fully formed slot 23' has, however, a rectilinear shape 40 or degenerates into a bottle shape 41 in its lower regions, the critical upper region has a near vertical sidewall. Thus, as shown in FIG. 2c, when filler material 16 is applied to the slot no voids are formed in these upper regions. Consequently, after etchback, which removes the silicon dioxide layer 11 and excess filler material 16, the surface 24 is uniform and solid. Should any portion of the coating 22' be exposed on the surface, it will form a continuous planar region in combination with the surface of filler material 16' and the surface of semiconductor substrate 10. Finally, when an overlying layer 38 of passivation material and then a metal layer 39 is applied, an even, uninterrupted line results. Thus, integrated circuit regions 25 and 26 are fully isolated by residual filler material 16' and yet electrical connections may be made between portions of circuits on each of integrated circuits 25 and 26.

Figure 4A:
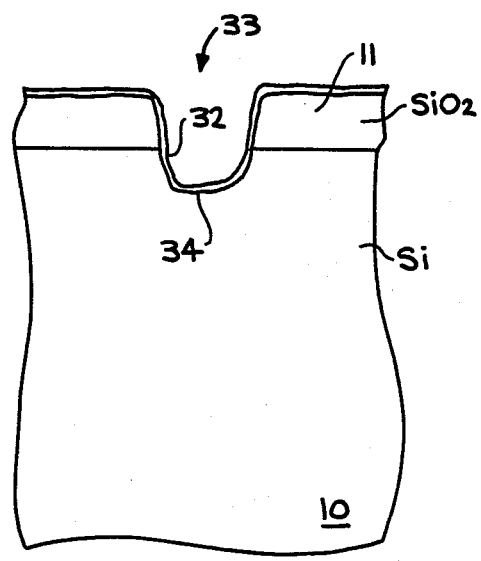
FIG. 4a is a cross-sectional view of the region of FIG. 1b after a coating of etch resistant material has been applied to the exposed silicon surface in the partially formed groove and to the upper surface of the silicon dioxide mask.
Figure 4B:
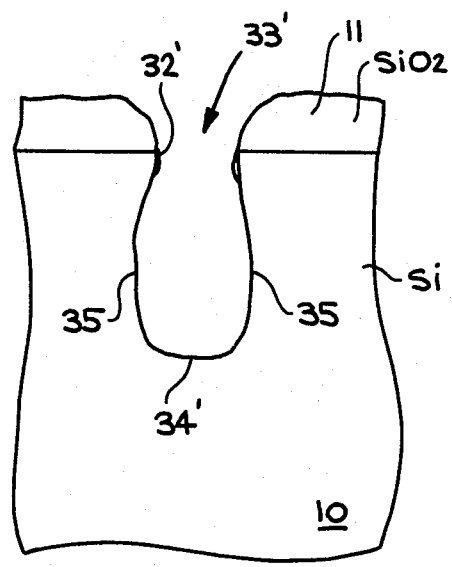
FIG. 4b is a cross-sectional view of FIG. 4a after the slot has been fully formed.
Figure 4C:
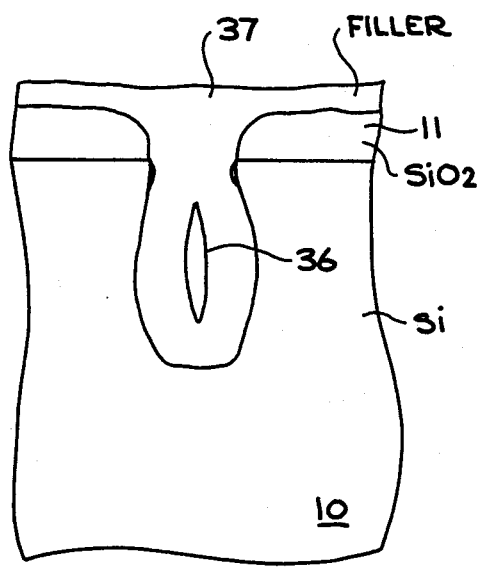
FIG. 4c is a cross-sectional view of FIG. 4b after a filler material has been introduced by isotropic growth means such as low pressure chemical vapor deposition.
Figure 4D:
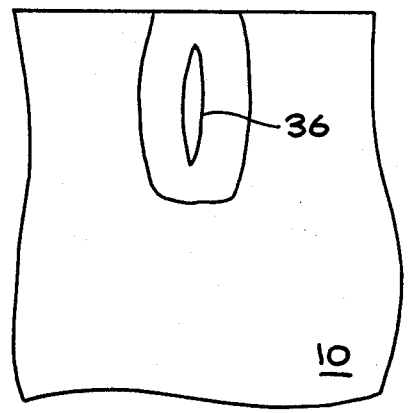
FIG. 4d is a cross-sectional view of the region of FIG. 4c after excess filler material and silicon dioxide have been removed.

An additional problem which is overcome by the process of the present invention as described above, is shown in FIGS. 4a–4d. Here, a coating 32 is applied to the slot being formed as well as to the upper layer of silicon dioxide mask 11. As the slot is formed, the lower region assumes a bottle shape 35. The bottom 34' of the slot is essentially congruous with the partially formed bottom 34. However, the walls 35 have formed a significant bottle shape. Yet, due to the presence of the residual portions of covering 32', the critical upper regions have a near vertical shape. In this case, as shown in FIG. 4c, the filler material 37 has been grown by an isotropic growth process such as low pressure chemical vapor deposition. Thus, the thickness of the grown layer is uniform everywhere. Due to the bottle shape of the slot, there will be a void region 36 centrally disposed within the slot. The shape and size of the void is fixed once the opening of the slot is filled with filler material since the gas species which produces growth can no longer reach into the interior regions of the slot. However, due to the near vertical sidewalls at the upper critical regions of the slot, the void 36 is located low enough so that when the surface is etched back, as shown in FIG. 4d, it is not exposed to the surface. Without the application of the coating material while the slot is being formed in accordance with the present invention, the bottle shape of the slot could extend up into the critical upper regions so that the void 36 could be exposed on the surface to produce a pit and resultant breaks in overlying layers of passivation and metallization.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A process for fabricating slots in a wafer of semiconductor material wherein the slots have nearly vertical sidewalls near the mouth of the slot, comprising the steps of:

applying an etch-resistant mask material to the surface of said wafer of semiconductor material;

patterning said mask material to expose regions in said substrate in which slots are to be formed;

etching said exposed regions in said substrate to form said slots; and forming an etch resistant coating on the walls of said slots while they are being formed whereby said etch resistant coating protects said sidewalls near the mouth of the slot from unwanted etching so they retain a nearly vertical shape.

2. A process for fabricating slots in accordance with claim 1 wherein said step of forming an etch resistant coating is accomplished by the step of supplying a partial pressure of oxygen in the chamber in which said wafer is being etched while said slots are being formed.

3. A process for fabricating slots in accordance with claim 1 wherein said step of etching said exposed regions comprises the step of etching said exposed regions in said substrate until said slots are partially formed and wherein said step of forming an etch resistant coating is accomplished by the step of:
  treating the surface of said partially formed slot to form an etch resistant coating after said slots are partially formed.

4. A process for fabricating slots in accordance with claim 3 wherein said step of treating said surface of said partially formed slot is accomplished by the step of thermally oxidizing the exposed surface of the semiconductor material in said partially formed slot.

5. A process for fabricating slots in accordance with claim 3 wherein said step of treating the surface of said partially formed slot is accomplished by the step of exposing the surface of said partially formed slots to a solution of hydrogen peroxide.

6. A process for fabricating slots in accordance with claim 5 wherein said step of exposing the surface of said partially formed slots to a solution of hydrogen peroxide is accomplished by the step of exposing the surface of said partially formed slots to a 30% solution of hydrogen peroxide in water for about ten minutes.

7. A process for fabricating slots in accordance with claim 3 wherein said step of treating the surface of said partially formed slot is accomplished by the step of applying a layer of etch resistant material by low pressure chemical vapor deposition.

8. A process for fabricating slots in accordance with claim 7 wherein said step of applying a layer of etch resistant material by low pressure chemical vapor deposition comprises the step of applying a layer of silicon nitride by low pressure chemical vapor deposition.

9. A process for fabricating slots in accordance with claim 3 wherein said step of etching said exposed regions in said substrate until said slots are partially formed is accomplished by the step of etching said exposed regions to a depth of less than about one micron.

10. A process for fabricating slots in accordance with any one of claims 3-9 wherein after said step of treating the surface of said partially formed slot the following step is carried out:
  etching said partially formed slot to a desired depth.

11. A process for fabricating slots in accordance with claim 10 wherein after said step of etching said partially formed slot to a desired depth the following steps are carried out:
  forming an etch resistant coating on the sidewalls of said slot at least adjacent the mouth of said slot; and
  etching the as formed slot to an additional desired depth.

12. A process for fabricating slots in accordance with claim 10 wherein after said step of etching said partially formed slot to a desired depth the following steps are carried out:
  filling said slot with a material which substantially fills the volume of the slot and conforms to the contours of the slot; and
  etching the surface of said wafer to remove excess filler material and expose a planar surface suitable for serving as a foundation for overlying layers.

13. A process for fabricating slots in accordance with claim 12 wherein after said step of etching said surface of said wafer to remove excess filler material the following steps are followed:
  applying a layer of passivating material to the surface of said wafer; and
  applying a conductive metal layer over portiqns of the surface of said layer of passivating material.

* * * * *